(12) United States Patent
Willer et al.

(10) Patent No.: US 7,061,046 B2
(45) Date of Patent: Jun. 13, 2006

(54) NON-VOLATILE SEMICONDUCTOR MEMORY DEVICE

(75) Inventors: Josef Willer, Riemerling (DE); Thomas Mikolajick, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/952,233

(22) Filed: Sep. 28, 2004

(65) Prior Publication Data

US 2006/0065921 A1    Mar. 30, 2006

(51) Int. Cl.
*H01L 29/792*    (2006.01)
(52) U.S. Cl. ............... 257/324; 257/213; 257/288; 257/314
(58) Field of Classification Search ............... None
See application file for complete search history.

(56) References Cited

U.S. PATENT DOCUMENTS

| | | | |
|---|---|---|---|
| 5,063,171 A | | 11/1991 | Gill |
| 5,661,043 A | * | 8/1997 | Rissman et al. |
| 6,015,977 A | * | 1/2000 | Zahorik |
| 6,878,988 B1 | * | 4/2005 | Lee et al. |
| 2003/0036250 A1 | * | 2/2003 | Lin et al. |
| 2004/0021171 A1 | | 2/2004 | Nishizaka |

OTHER PUBLICATIONS

Eitan, B., et al., "NROM: A Novel Localized Trapping, 2-Bit Nonvolatile Memory Cell," IEEE Electron Device Letters, vol. 21, No. 11, Nov. 2000, pp. 543-545.

* cited by examiner

*Primary Examiner*—Nathan J. Flynn
*Assistant Examiner*—Kevin Quinto
(74) *Attorney, Agent, or Firm*—Slater & Matsil, L.L.P.

(57) ABSTRACT

Bitline conductor tracks are arranged parallel to one another and electrically insulated from a substrate provided with a basic doping. A memory layer sequence, especially a charge-trapping layer sequence with a dielectric memory layer between dielectric confinement layers, is provided at least in regions adjacent to the bitline conductor tracks. The memory cells comprise gate electrodes connected by wordlines, and channel regions below the gate electrodes. They can be programmed by the trapping of channel hot electrons that are accelerated between source and drain regions formed by induced bitlines that are generated by the application of voltages to the bitline conductor tracks.

20 Claims, 3 Drawing Sheets

NON-VOLATILE SEMICONDUCTOR MEMORY DEVICE

TECHNICAL FIELD

The preferred embodiment of the invention concerns a semiconductor memory device with an array of non-volatile memory cells comprising a memory layer sequence as storage means, which can be applied as a flash memory. The memory layer sequence can be a layer sequence of dielectric materials provided for charge-trapping, especially in the fashion of SONOS or NROM cells.

BACKGROUND

Typical applications of memory products require a steady miniaturization of the memory cells. A reduction of the area that is required by an individual memory cell can be obtained by shrinking the cell structure or by an increase of the number of bits that can be stored within one memory cell transistor structure. A further scaling down of the cell structures is limited by the production methods, not all of which can be modified without difficulties in order to enable the production of devices comprising the desired extremely small dimensions. This is especially true with respect to the formation of junctions between thin n-doped regions and p-doped regions. This is due to the fact that the doping atoms diffuse out of the implantation region so that the junctions become less precisely defined and the required minimal concentration of doping atoms is no longer present in the whole implantation region. This means that it becomes increasingly difficult to produce doped source/drain regions of the cell transistors and connecting buried bitlines which are sufficiently shallow.

This problem can at least partly be obviated by the use of special bitline formation masks or by an implantation that is performed self-aligned to the wordlines. In this way, the implantations can properly be adjusted and the junctions of the source and drain regions rendered more precisely limited. But this also implies that the production equipment must meet additional requirements.

Non-volatile memory cells that are electrically programmable and erasable and are especially suitable to be arranged in a virtual ground NOR architecture can be realized as charge-trapping memory cells. These cells comprise a memory layer sequence of dielectric materials with a memory layer between confinement layers of dielectric material having a larger energy band gap than the memory layer. The memory layer sequence is arranged between a channel region within a semiconductor body and a gate electrode provided to control the channel by means of an applied electric voltage. Charge carriers running from source to a drain through the channel region are accelerated and gain enough energy to be able to penetrate the lower confinement layer and to be trapped within the memory layer. The trapped charge carriers change the threshold voltage of the cell transistor structure. Different programming states can be read by applying the appropriate reading voltages.

Examples of charge-trapping memory cells are the SONOS memory cells, in which each confinement layer is an oxide and the memory layer is a nitride of the semiconductor material, usually silicon. Charge-trapping memory cells are usually programmed by channel hot electrons (CHE) and can be erased by the injection of hot holes from the channel region or by Fowler-Nordheim tunneling.

A publication by B. Eitan et al., "NROM: a Novel Localized Trapping, 2-Bit Nonvolatile Memory Cell" in IEEE Electron Device Letters, volume 21, pages 543 to 545 (2000), which is incorporated herein by reference, describes a charge-trapping memory cell with a memory layer sequence of oxide, nitride and oxide which is especially adapted to be operated with a reading voltage that is reverse to the programming voltage (reverse read). The oxide-nitride-oxide layer sequence is especially designed to avoid the direct tunneling regime and to guarantee the vertical retention of the trapped charge carriers. The oxide layers are specified to have a thickness of more than 5 nm.

The memory layer can be substituted with another dielectric material, provided the energy band gap is smaller than the energy band gap of the confinement layers. The difference in the energy band gaps should be as great as possible to secure a good charge carrier confinement and thus a good data retention. When using silicon dioxide as confinement layers, the memory layer may be tantalum oxide, cadmium silicate, titanium oxide, zirconium oxide or aluminium oxide. Also intrinsically conducting (non-doped) silicon may be used as the material of the memory layer.

SUMMARY OF THE INVENTION

In one aspect, the present invention further reduces cell dimensions in a non-volatile semiconductor memory device and avoids problems arising from the diffusion of doping atoms at the junctions of the source/drain regions.

In a further aspect, the invention avoids parasitic currents to adjacent bitlines in charge-trapping semiconductor memory devices, especially in multi-bit memory devices.

In yet a further aspect, the invention reduces the complexity of the production methods of multi-bit charge-trapping semiconductor memory devices by the introduction of a more appropriate device structure.

The non-volatile semiconductor memory device according to embodiments of the invention comprises a semiconductor layer or substrate provided with a basic doping and having a main surface on which an array of bitline conductor tracks and wordlines is arranged. The bitline conductor tracks are arranged parallel to one another and electrically insulated from one another and from the semiconductor material. The wordlines are arranged above the bitline conductor tracks parallel to one another in a direction across the bitline conductor tracks and are also electrically insulated from one another, from the bitline conductor tracks and from the semiconductor material. A memory layer sequence is arranged at least in regions that are adjacent to one of the wordlines and one of the bitline conductor tracks.

Regions located within the semiconductor layer or substrate beneath the bitline conductor tracks are provided for induced bitlines to be generated by an electric potential that is applied to the corresponding bitline conductor track. Underneath at least one end of each of the bitline conductor tracks, there are doped regions, which are electrically connected to an addressing circuit by means of main bitlines. Means to apply programming, reading and erasing voltages to the bitline conductor tracks, the doped regions and the wordlines are provided and preferably integrated as an addressing circuitry into the memory device.

These and other features and advantages of the invention, especially if applied to multi-bit NROM cells operated with channel hot electron injection or source side injection, will become apparent from the following brief description of the drawings, detailed description and appended claims and drawings.

BRIEF DESCRIPTION OF THE DRAWINGS

For a more complete understanding of the present invention, and the advantages thereof, reference is now made to the following descriptions taken in conjunction with the accompanying drawings, in which.

The following list of reference symbols can be used in conjunction with the figures:

| 1 | bitline conductor track | 9 | recess |
|---|---|---|---|
| 2 | induced bitline | 10 | spacer |
| 3 | wordline | D | bitline conductor track |
| 4 | memory layer sequence | E | bitline conductor track |
| 5 | dielectric | F | bitline conductor track |
| 6 | doped region | d | induced bitline |
| 7 | substrate | e | induced bitline |
| 8 | isolation | f | induced bitline |

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Various aspects of the present invention will now be described in the context of a semiconductor memory that includes a memory cell array at a main surface of a silicon layer or substrate. The main surface is provided with a basic doping, on which gate electrodes and bitline conductor tracks are arranged, which are electrically insulated from one another and from the semiconductor material. The bitline conductor tracks can be structured in one or more layers, each of these layers preferably comprising a material of the group of polysilicon, a silicide and a metal. A memory layer sequence, for example an oxide-nitride-oxide layer sequence suitable for charge-trapping, is provided as a means of storage at least in the vicinity of the gate electrodes. The silicon layer or substrate is preferably p-silicon, but may also be n-silicon. At the margin of the memory cell array, the bitline conductor tracks overlap with doped regions in the semiconductor material, which are connected to an addressing circuitry via main bitlines, possibly by the use of select transistors.

Above the bitline conductor tracks, an electric insulator, like an inter electrode dielectric, is arranged, which can be silicon dioxide, silicon nitride, ONO or another suitable insulator material. The wordlines are arranged above this insulator across the direction of the bitlines and may consist of polysilicon, silicide or metal. The wordlines are covered by another insulator, for example silicon dioxide, which may be the basic layer of the usual wiring metalizations and intermetal dielectrics.

Figure 1:
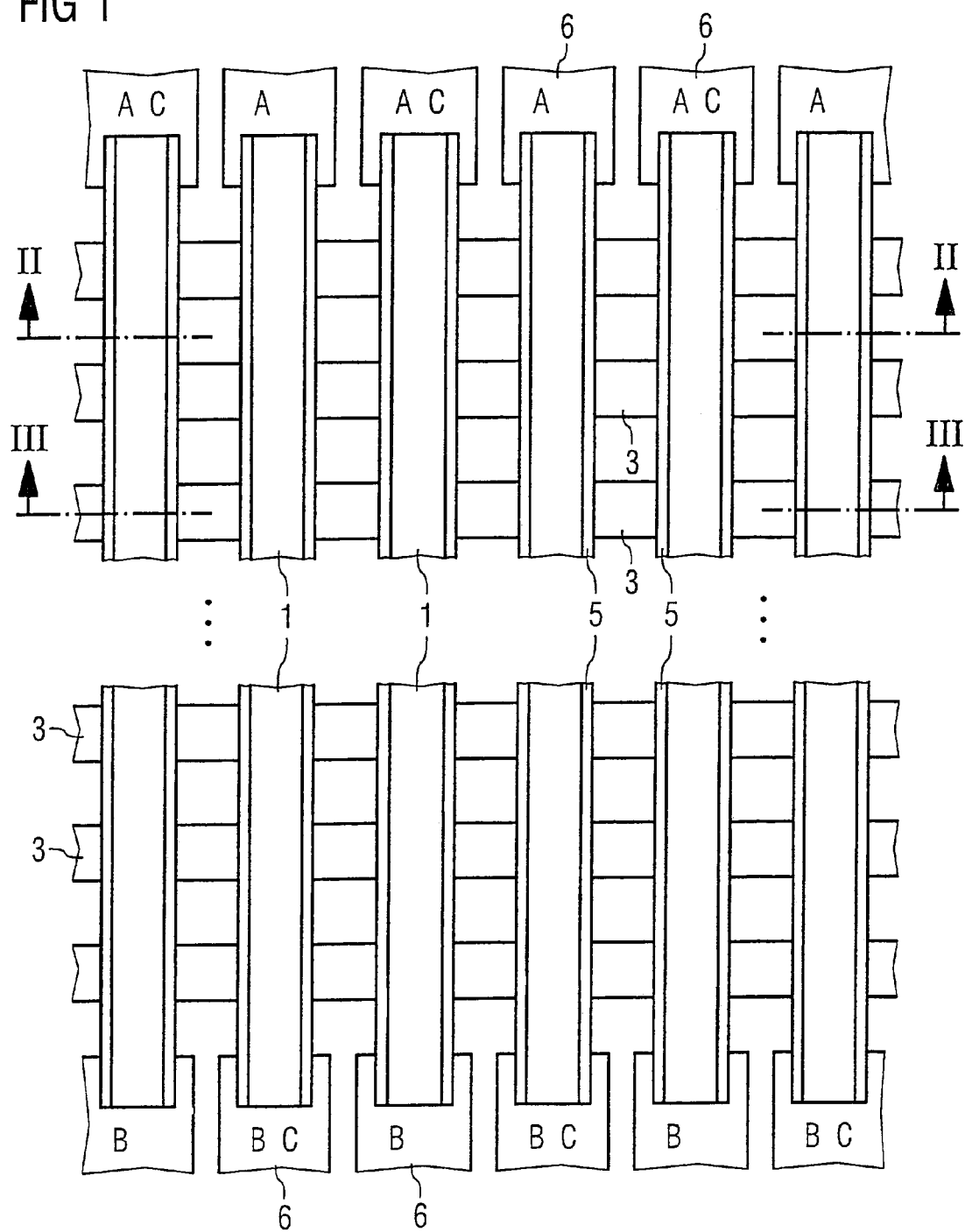
FIG. 1 shows a top view on the arrangement of wordlines and bitlines of the semiconductor memory device.

FIG. 1 shows a top view of a section of the semiconductor memory device showing in schematic representation the arrangement of the bitline conductor tracks 1, the wordlines 3, the lateral insulating dielectric 5 of the bitline conductor tracks 1, and the diffusion regions 6. The bitline conductor tracks 1 are arranged parallel to one another at a certain distance from one another, and are electrically insulated by suitable dielectric material. The wordlines 3 are arranged parallel to one another above the bitline conductor tracks 1 and across the direction of the bitline conductor tracks 1. The top view of FIG. 1, which is a section taken at a level of the bitline conductor tracks, shows only those parts of the wordlines 3 which are located between the bitline conductor tracks 1 and which form the gate electrodes of the individual memory cells.

These lower parts of the wordlines that form the gate electrodes are electrically insulated from the bitline conductor tracks by the dielectric 5. The gate electrodes are above the channel regions, and the source and drain regions of the memory cell transistor structures are situated underneath the crossing points of the bitline conductor tracks and the wordlines. There are no buried bitlines or direct contacts of the bitline conductor tracks on the source and drain regions. The bitline conductor tracks 1 are electrically insulated from the semiconductor material. The electric paths joining the source/drain regions in the direction of the bitline conductor tracks are formed by induced inversion layers, which are generated by the application of a suitable electrical potential to the bitline conductor tracks 1.

At the end of the bitline conductor tracks 1, there are diffusion regions, which are of n-type conductivity in the case of a p-doped substrate. The diffusion regions are connected to the main bitlines leading to the addressing circuits of a periphery. It is sufficient if these diffusion regions are arranged on one side of the memory cell array at the ends of the bitline conductor tracks, as indicated by the letter A in FIG. 1. The diffusion regions may be arranged on either side of the memory cell array so that the alternative location indicated by the letter B in FIG. 1 is also possible. If the bitline conductor tracks 1 are arranged at a very small distance to one another, it may be preferable to arrange the diffusion regions 6 at alternating ends of the bitline conductor tracks as indicated by the letter C in FIG. 1.

The bitline conductor tracks 1 are not electrically connected to the diffusion regions so that different electric voltages can be applied to the diffusion regions and the bitline conductor tracks. By the application of a suitable voltage to the bitline conductor tracks 1, bitlines are induced in the semiconductor material beneath the bitline conductor tracks 1. These induced bitlines substitute for buried bitlines, which are formed by the implantation of doping atoms in previously known devices. There are no buried bitlines of this kind here, and the semiconductor material of the substrate can be provided with a basic doping of uniform concentration throughout the area of the memory cell array. This is further explained in the following description of the other figures.

Figure 2:
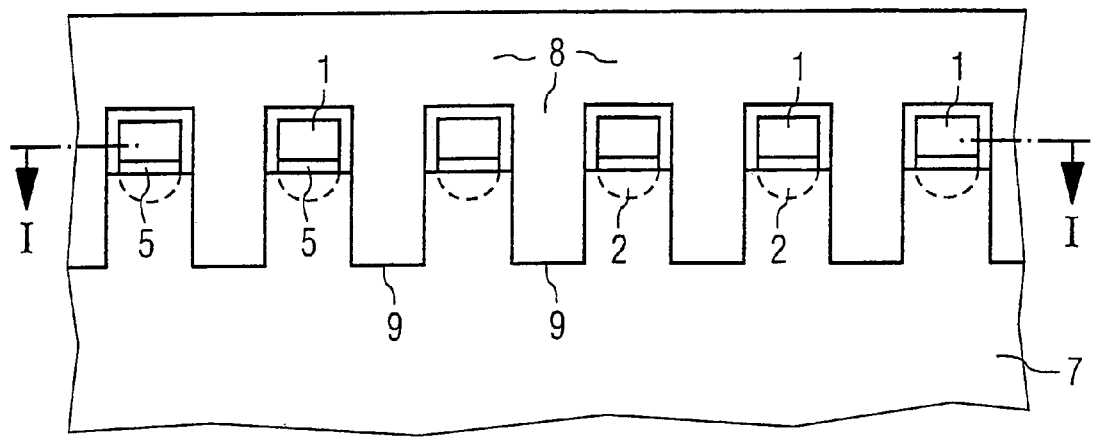
FIG. 2 shows the cross-section indicated in FIG. 1 across a first exemplary embodiment of the device.

FIG. 2 shows a cross-section at the position indicated in FIG. 1. The bitline conductor tracks 1 are arranged on an upper main surface of the semiconductor substrate 7. In a preferred embodiment, there are recesses 9, which are etched into the substrate 7, in the regions between the bitlines. The regions of the induced bitlines 2 are indicated by broken lines. The induced bitlines will appear as inversion layers in the semiconductor material only after the application of a suitable electric potential to the bitline conductor tracks 1. The recesses 9, the spaces between the bitline conductor tracks, and the top are filled with material of an isolation 8. The level of the section of the top view according to FIG. 1 is indicated by the broken line and the arrows on both sides of FIG. 2.

Figure 3:
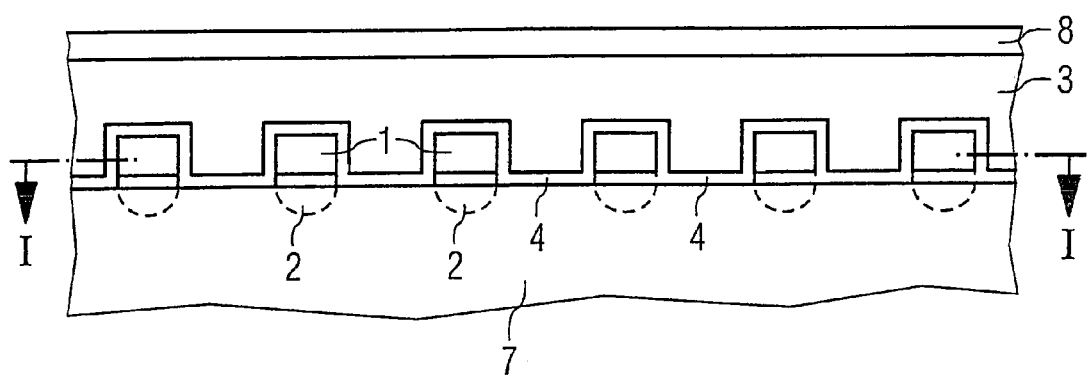
FIG. 3 shows the second cross-section indicated in FIG. 1 through the first embodiment along a wordline.

FIG. 3 shows the cross-section indicated in FIG. 1 along one of the wordlines 3. The lower parts of the wordlines 3 form the gate electrodes above the channel regions, which are located between the regions of the induced bitlines 2, which form the source and drain regions of the transistor structures in this section. Between the gate electrode and the channel region, the memory layer sequence 4 is arranged, which may be an oxide-nitride-oxide layer sequence or another suitable sequence of dielectric materials provided for charge-trapping. This memory layer sequence may also form the upper electric insulation of the bitline conductor tracks 1. If this layer sequence is applied throughout the main surface of the substrate 7, it may also serve as electric insulation between the bitline conductor tracks 1 and the semiconductor material. In the embodiment shown in FIG. 3, dielectric material different from the memory layer sequence is arranged in the regions beneath the bitline conductor tracks 1.

Figure 4:
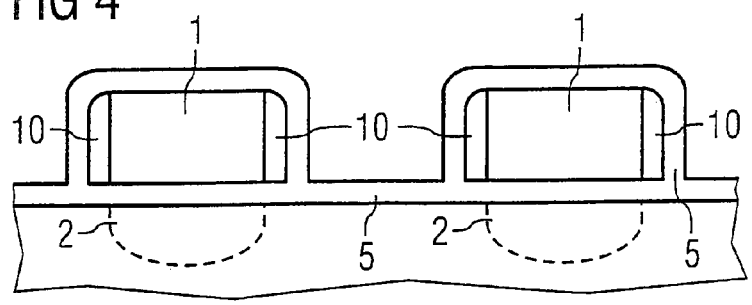
FIG. 4 shows a magnified section of a cross-section according to FIG. 3 of a second exemplary embodiment.

FIG. 4 shows a magnified section of the cross-section according to FIG. 3 of an alternative embodiment. The memory layer sequence 4 is here restricted to sidewall spacers 10 at the lateral sides or flanks of the bitline conductor tracks 1. The bitline conductor tracks 1 are additionally insulated on all sides by the dielectric 5, which is also applied as gate dielectric between the gate electrode and the channel region. The sidewall spacers can be produced in the usual way by conformal deposition of a layer of the spacer material and a subsequent anisotropic etching, which leaves only the vertically extending parts of the layer.

Figure 5:
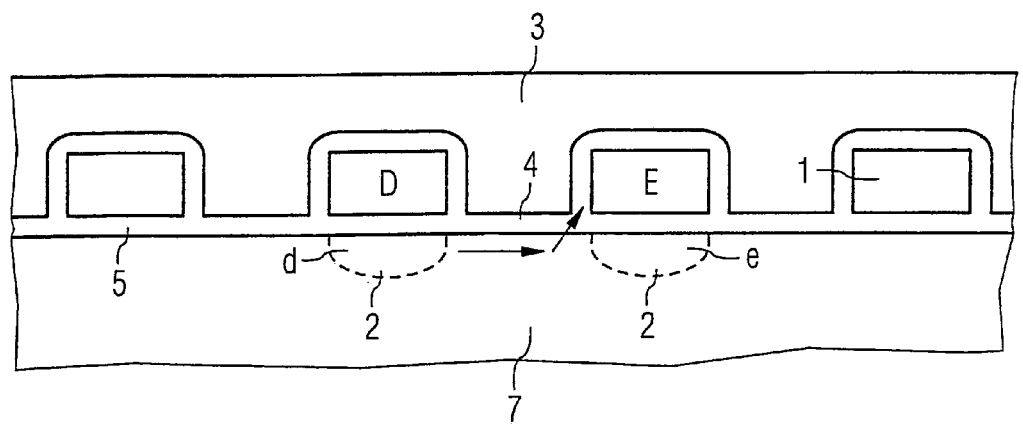
FIG. 5 shows a scheme of the programming process by CHE according to the cross-section of FIG. 3.

FIG. 5 shows the cross-section according to FIG. 3 to exemplify the programming process in an embodiment with charge-trapping memory cells. The programming by channel hot electron (CHE) injection takes place at the channel end adjacent to the drain region, where the electrons have gained their maximum velocity. FIG. 5 shows an embodiment with the memory layer sequence 4 forming the dielectric 5 which insulates the bitline conductor tracks 1 from the semiconductor material and from the wordlines 3. If one bit is to be programmed at the location near the bitline conductor track marked E in FIG. 5 by hot electron injection, a positive voltage of typically about 2 to 6 volts is applied to the two neighboring bitline conductor tracks designated with D and E in FIG. 5. This will induce inversion layers in the semiconductor material of substrate 7 and thereby generate the induced bitlines 2, which are designated by the broken lines. The memory cell defined by the transistor structure of these induced bitlines, functioning as source and drain regions, and the appertaining wordline 3, functioning as gate electrode, can then be operated on the programming voltages.

To this end, a high voltage of typically about 3.5 to 7 volts is applied to the induced bitline e at that channel end where the bit is to be programmed. This voltage is applied via the corresponding doped region, which connects the region of the induced bitline to the main bitline leading to the peripheral addressing circuitry. The doped region of the other induced bitline d is grounded so that the ground potential is present on the induced bitline d. The wordline 3 is addressed in the usual way to open the channel by means of the corresponding gate electrode, for example by the application of an electric potential of typically about 9 volts. This results in the acceleration of charge carriers along the channel as indicated by the arrow in FIG. 5. This produces hot electrons, which means that the electrons have a high velocity and sufficient kinetic energy to be able to pass the lower confinement layer of the memory layer sequence in the direction of the short arrow pointing upwards to bitline conductor track E, shown in FIG. 5. In this way, one bit is programmed at the position, which is immediately adjacent to bitline conductor track E on the side looking towards bitline conductor track D. In this process the induced bitlines 2 function in the same way as common buried bitlines of previously known devices. At the other end of the channel, at the position adjacent to bitline conductor track D on the side looking towards bitline conductor track E, a second bit can be programmed by applying the reverse electric voltage to the induced bitlines d and e.

Figure 6:
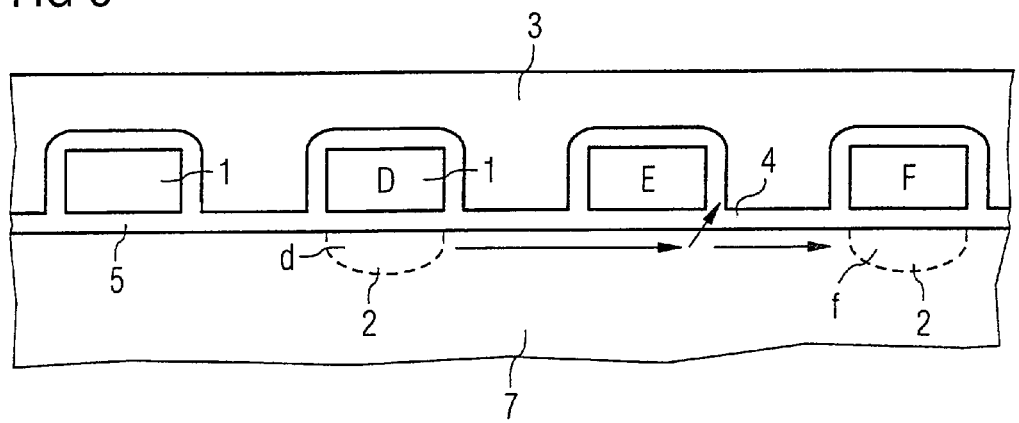
FIG. 6 shows a scheme of the programming process by source side injection according to the cross-section of FIG. 3.

FIG. 6 shows a scheme according to FIG. 5 for the process of the so-called source side injection. In this programming mode, two not immediately subsequent bitline conductor tracks D and F are connected to the driving voltage of typically about 2 to 6 volts to induce the inversion layers to form the induced bitlines 2 shown in FIG. 6 with broken lines. An electric potential that is slightly elevated above the ground potential is preferably applied to the intermediate bitline conductor track E. This voltage should be slightly above the threshold voltage of the underlying semiconductor material so that bitline conductor track E may typically be at about one volt. When a high voltage is applied to the induced bitline f on the right side of FIG. 6 and the induced bitline d is grounded via the corresponding doped regions, while the other doped regions are left floating, a peak in the lateral electric field is generated in the region beneath bitline conductor track E, which will lead to a high generation rate of hot electrons in that region and subsequently to a high injection of electrons into the memory layer sequence at the location indicated by the short arrow pointing upwards in FIG. 6. By applying the reverse voltage to the induced bitlines d and f, the bit on the other side of bitline conductor track E can be programmed. In this manner, by the appropriate choice of the addressed bitlines, all the bits at positions adjacent to the two lower edges of each bitline conductor track can be programmed.

To read a specific bit, the two appertaining bitlines are used to generate the induced bitlines by the application of the suitable voltages. Then the induced bitline adjacent to the bit that is to be read is grounded and the other induced bitline is set to the small read voltage of typically 1 to 2 volts, which must be chosen sufficiently low to avoid channel hot electron generation. When an electric potential of typically about 3 to 5 volts is applied to the gate electrode via the corresponding wordline, a high or low current, depending on the programming state of the sensed bit, will flow through the channel from the source region to the drain region, which are each formed by a section of the induced bitlines.

Erasure is performed by Fowler-Nordheim tunneling of electrons from the traps in the memory layer either to the substrate or to the gate electrode. The thicknesses and the relative dielectric constants or relative permittivities of the materials of the memory layer sequence are appropriately chosen so that it is possible to induce electrons to leave the memory layer by tunneling, by the application of a suitable voltage between the substrate and the gate electrode, without at the same time generating a current of electrons that enter the memory layer from the opposite side. The first option is realized by the application of a high positive voltage of typically about 5 to 10 volts to the substrate and a high negative voltage of typically about −10 to −5 volts to the wordline. Instead, a tunneling of electrons to the control gate takes place, if a reverse voltage is applied between the gate electrode and the substrate.

The disclosed inventive memory device is especially advantageous, because the induced bitlines do not suffer from an outdiffusion of doping atoms from an implanted region. The induced bitlines are comparatively shallow, which results in an excellent short channel behaviour. Furthermore, thin oxides can be provided in the case of a structured charge-trapping layer sequence comprising oxide confinement layers. Parasitic currents to adjacent bitlines are effectively avoided. Different operation modes of the memory cells are feasible by the application of appropriate electric voltages to the bitlines and wordlines. A low programming voltage is possible in the case of source side injection. Furthermore, the structure of a device according to the invention is less complicated than ordinary devices that are operated by source side injection, because it is not necessary to integrate additional gate electrodes to be supplied with a separate electric potential above the channel region to enable a programming by source side injection.

Although the present invention and its advantages have been described in detail, it should be understood that various changes, substitutions and alterations can be made herein without departing from the spirit and scope of the invention as defined by the appended claims.

What is claimed is:

1. A semiconductor memory device comprising:
   a semiconductor body provided with a basic doping and having a main surface;
   an array of bitline conductor tracks arranged over said main surface, said bitline conductor tracks being arranged parallel to one another and electrically insulated from said semiconductor body;
   an array of wordlines arranged over said main surface, said wordlines being arranged above said bitline conductor tracks parallel to one another in a direction across said bitline conductor tracks and being electrically insulated from said bitline conductor tracks and from said semiconductor body;
   a memory layer sequence being arranged at least in regions that are adjacent to one of said wordlines and one of said bitline conductor tracks, wherein said memory layer sequence is formed as sidewall spacers at lateral sides of said bitline conductor tracks, each spacer being arranged between one of said bitline conductor tracks and an adjacent lower part of one of said wordlines which forms a gate electrode;
   regions located within said semiconductor body beneath said bitline conductor tracks and provided for induced bitlines to be generated by an electric potential that is applied to said bitline conductor tracks; and
   doped regions provided underneath at least one end of each of said bitline conductor tracks and electrically connected to an addressing circuit.

2. The semiconductor memory device according to claim 1, further comprising means for applying voltages to said doped regions, said bitline conductor tracks and said wordlines.

3. The semiconductor memory device according to claim 1, wherein said memory layer sequence is arranged in regions of said main surface between two adjacent bitline conductor tracks and between said main surface and said wordlines.

4. The semiconductor memory device according to claim 1, wherein the semiconductor body comprises a semiconductor layer.

5. The semiconductor memory device according to claim 1, wherein the semiconductor body comprises a semiconductor substrate.

6. The semiconductor memory device according to claim 1, wherein said memory layer sequence comprises a memory layer of dielectric material between confinement layers of a further dielectric material that has a larger energy band gap than the memory layer.

7. The semiconductor memory device according to claim 6, wherein said confinement layers comprise thicknesses and relative dielectric constants or relative permittivities to enable an erasure operation by Fowler-Nordheim tunneling of electrons out of said memory layer by an application of a voltage between the semiconductor body and a wordline.

8. The semiconductor memory device according to claim 6, wherein said memory layer and said confinement layers comprise thicknesses that are adapted to the formation of an NROM cell.

9. The semiconductor memory device according to claim 6, wherein said memory layer comprises silicon nitride.

10. The semiconductor memory device according to claim 9, wherein said confinement layers comprise silicon oxide.

11. The semiconductor memory device according to claim 1, further comprising an addressing circuitry provided to enable a programming by source side injection.

12. The semiconductor memory device according to claim 11, wherein the addressing circuitry further comprises means to apply a driving voltage to two not immediately subsequent bitline conductor tracks.

13. The semiconductor memory device according to claim 1, wherein the memory layer sequence comprises a memory layer of dielectric material between confinement layers of a further dielectric material.

14. The semiconductor memory device according to claim 13, wherein the confinement layers comprise silicon oxide.

15. The semiconductor memory device according to claim 13, wherein the memory layer comprises silicon nitride.

16. The semiconductor memory device according to claim 15, wherein the confinement layers comprise silicon oxide.

17. A semiconductor memory device comprising:
   a semiconductor body provided with a basic doping and having a main surface;
   an array of bitline conductor tracks arranged over said main surface, said bitline conductor tracks being arranged parallel to one another and electrically insulated from said semiconductor body;
   an array of wordlines arranged over said main surface, said wordlines being arranged above said bitline conductor tracks parallel to one another in a direction across said bitline conductor tracks and being electrically insulated from said bitline conductor tracks and from said semiconductor layer or substrate;
   a memory layer sequence being arranged at least in regions that are adjacent to one of said wordlines and one of said bitline conductor tracks;
   regions located within said semiconductor body beneath said bitline conductor tracks and provided for induced bitlines to be generated by an electric potential that is applied to said bitline conductor;
   doped regions provided underneath at least one end of each of said bitlines and electrically connected to an addressing circuit; and
   addressing circuitry provided to enable a programming by source side injection, wherein the addressing circuitry further comprises circuitry to apply a driving voltage to two not immediately subsequent bitline conductor tracks.

18. The semiconductor memory device according to claim 17, wherein said memory layer sequence is formed as sidewall spacers at lateral sides of said bitline conductor tracks, each spacer being arranged between one of said bitline conductor tracks and an adjacent lower part of one of said wordlines which forms a gate electrode.

19. The semiconductor memory device according to claim 17, wherein said memory layer sequence comprises a memory layer of dielectric material between confinement layers of a further dielectric material.

20. The semiconductor memory device according to claim 19, wherein said memory layer comprises silicon nitride and said confinement layers comprise silicon oxide.

* * * * *